(12) United States Patent
Liu et al.

(10) Patent No.: US 9,620,505 B2
(45) Date of Patent: Apr. 11, 2017

(54) SEMICONDUCTOR DEVICE WITH DIFFERENT FIN SETS

(71) Applicants: INTERNATIONAL BUSINESS MACHINES CORPORATION, Armonk, NY (US); STMICROELECTRONICS, INC, Coppell, TX (US); GLOBALFOUNDRIES INC., Grand Cayman (KY)

(72) Inventors: Qing Liu, Watervliet, NY (US); Xiuyu Cai, Niskayuna, NY (US); Ruilong Xie, Schenectady, NY (US); Chun-chen Yeh, Clifton Park, NY (US); Kejia Wang, Poughkeepsie, NY (US); Daniel Chanemougame, Grenoble (FR)

(73) Assignees: International Business Machines Corporation, Armonk, NY (US); STMicroelectronics, Inc., Coppell, TX (US); GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 15/073,100

(22) Filed: Mar. 17, 2016

(65) Prior Publication Data

US 2016/0197072 A1    Jul. 7, 2016

Related U.S. Application Data

(62) Division of application No. 14/280,998, filed on May 19, 2014, now Pat. No. 9,299,721.

(51) Int. Cl.
*H01L 21/30* (2006.01)
*H01L 27/088* (2006.01)
*H01L 27/12* (2006.01)
*H01L 29/66* (2006.01)
*H01L 21/84* (2006.01)
*H01L 29/06* (2006.01)
*H01L 29/161* (2006.01)

(52) U.S. Cl.
CPC ........ *H01L 27/0886* (2013.01); *H01L 21/845* (2013.01); *H01L 27/1211* (2013.01); *H01L 29/0649* (2013.01); *H01L 29/161* (2013.01); *H01L 29/66795* (2013.01)

(58) Field of Classification Search
CPC ................... H01L 27/1211; H01L 29/66795
USPC ........................................................ 438/455
See application file for complete search history.

(56) References Cited

U.S. PATENT DOCUMENTS

| | | | | |
|---|---|---|---|---|
| 2010/0151640 A1* | 6/2010 | Huebinger | ........ | H01L 21/76224 438/221 |
| 2011/0045648 A1* | 2/2011 | Knorr | ............... | H01L 21/76232 438/296 |
| 2015/0091057 A1* | 4/2015 | Xie | ..................... | H01L 27/0924 257/190 |

* cited by examiner

*Primary Examiner* — Matthew Gordon
(74) *Attorney, Agent, or Firm* — Law Offices of Ira D. Blecker, P.C.

(57) ABSTRACT

A semiconductor device which includes: a substrate; a first set of fins above the substrate of a first semiconductor material; a second set of fins above the substrate and of a second semiconductor material different than the first semiconductor material; and an isolation region positioned between the first and second sets of fins, the isolation region having a nitride layer. The isolation region may be an isolation pillar or an isolation trench.

19 Claims, 9 Drawing Sheets

SEMICONDUCTOR DEVICE WITH DIFFERENT FIN SETS

FIELD OF THE INVENTION

The present invention relates to the field of electronic devices and, more particularly, to semiconductor devices and related methods.

BACKGROUND OF THE INVENTION

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

In some implementations, different types of semiconductor materials may be used for different device types, such as silicon for NFET devices and silicon germanium (SiGe) for PFET devices, to provide desired electron or hole conductivity, respectively. With ever-increasing device integration densities, (e.g., 10 nm and beyond), for semiconductor on insulator (SOI) implementations, FINFETS with different types of fin materials may be challenging to implement.

As such, further enhancements in semiconductor devices may be desirable in some applications, such as next generation FINFET devices with relatively small dimensions, for example.

SUMMARY OF THE INVENTION

An exemplary semiconductor device may include a substrate, a first set of fins above the substrate comprising a first semiconductor material, a second set of fins above the substrate and comprising a second semiconductor material different than the first semiconductor material, and an isolation region positioned between the first and second sets of fins, the isolation region having a nitride layer.

Another exemplary semiconductor device may include a substrate, a first set of fins above the substrate comprising a first semiconductor material, a second set of fins above the substrate and comprising a second semiconductor material different than the first semiconductor material, and an isolation pillar extending above the substrate and positioned between the first and second sets of fins. The isolation pillar may include an inner oxide portion, a nitride layer on the inner oxide portion, and an outer oxide layer on the nitride layer.

Another exemplary semiconductor device may include a substrate, a first set of fins above the substrate comprising a first semiconductor material, and a second set of fins above the substrate and comprising a second semiconductor material different than the first semiconductor material. The substrate may have an isolation trench therein positioned between the first and second sets of fins, and a nitride liner in the isolation trench.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime or multiple prime notation is used to illustrate similar elements in different embodiments.

By way of background, uniform SiGe formation may be challenging to implement in relatively small scale devices, such as FINFETs, due to thermal budget concerns. More particularly, non-uniform SiGe material layers may cause a non-uniform response when performing fin etching. However, to form a relatively uniform SiGe fin layer, a very high thermal budget may be required. Yet, this may also cause the germanium to laterally diffuse into the material used for forming the NFET fins (e.g., into the adjacent semiconductor fin layer), which in turn may impact the adjacent NFET silicon fins. This problem may become particularly acute with smaller, advanced processing nodes. To avoid the diffusion problem, one might consider making the base silicon layer upon which the SiGe is deposited thin enough so that adequate germanium diffusion into this thin silicon layer may be accomplished without excessive diffusion into the NFET silicon region. Yet, the use of such thin "seed" silicon layers for the SiGe may result in other problems, such as agglomeration during the epitaxial deposition process, which may in turn lead to performance problems.

Figure 1:
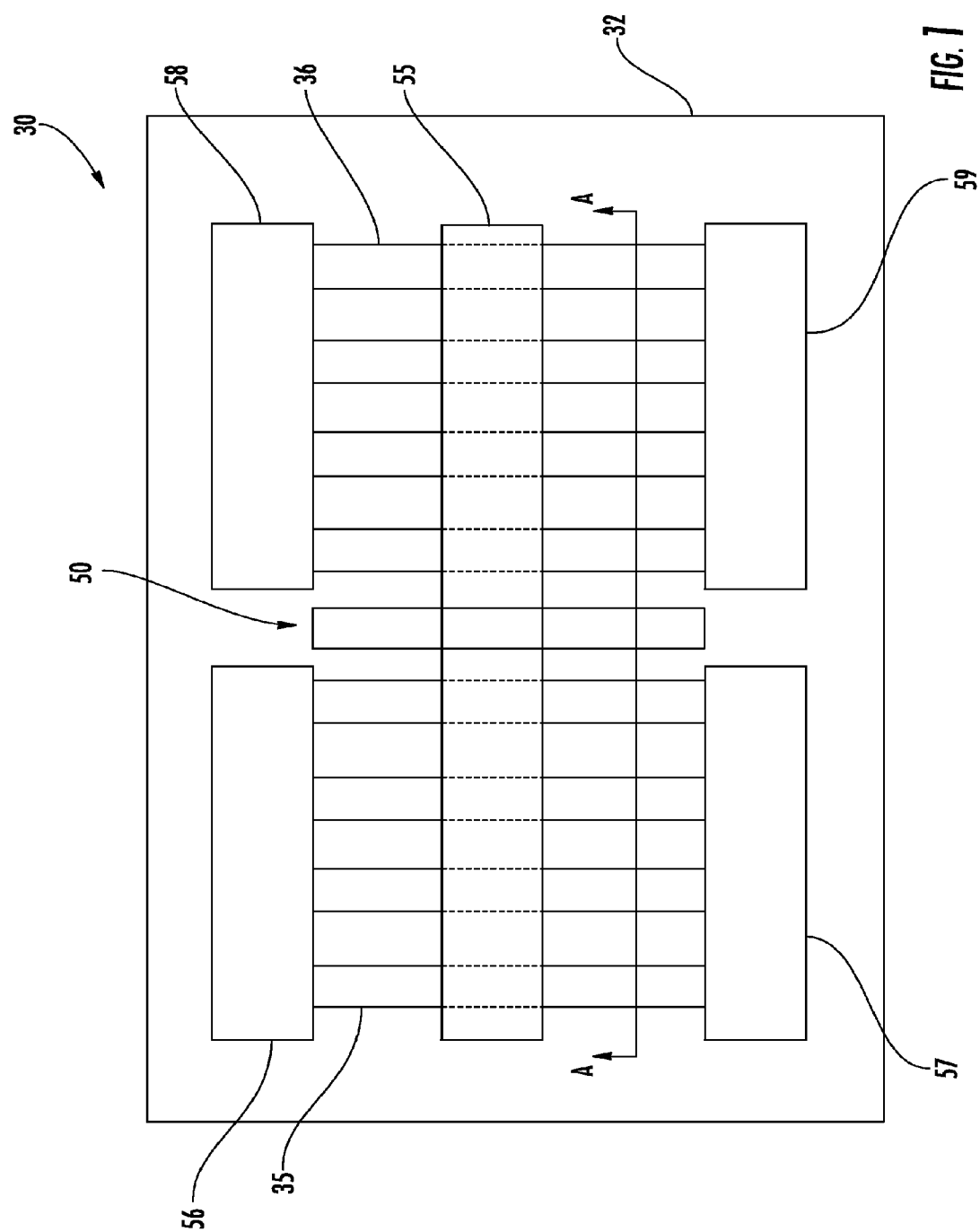
FIG. 1 is a top view of a semiconductor device in accordance with an example embodiment including an isolation pillar between adjacent sets of semiconductor fins.
Figure 2:
FIGS. 2-14 are a series of cross-sectional diagrams taken from the perspective of line A-A in FIG. 1 and illustrating a method for making the device of FIG. 1.
Figure 3:
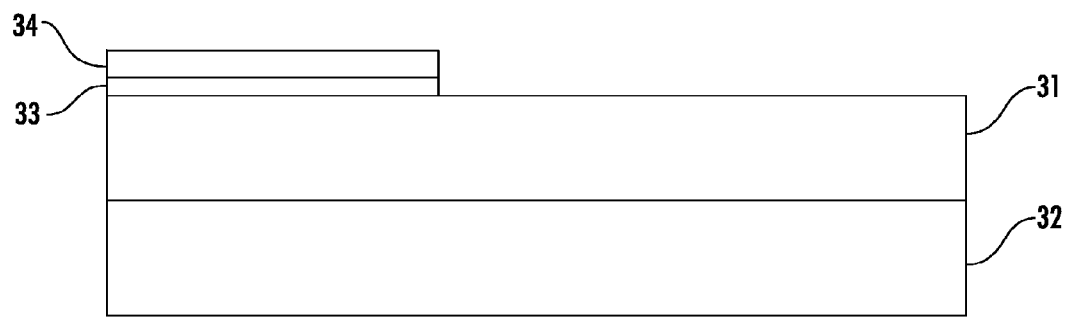

Turning now initially to FIGS. 1-2, a semiconductor device 30 and related method for making the device are first described. In the illustrated embodiment, the semiconductor device 30 is a FINFET which is formed from a semiconductor layer 31 (e.g., silicon) on a dielectric substrate 32 (e.g., $SiO_2$). By way of example, the semiconductor layer 31 and dielectric substrate 32 may be implemented as a fully depleted SOI (FDSOI) wafer, but the configurations described herein may also be implemented with other substrates such as partially-depleted SOI (PDSOI), Ultra-Thin Body and BOX (UTBB), etc. A dielectric (e.g., $SiO_2$) layer 33 may be formed overlying the semiconductor layer 31, and a nitride (e.g., SiN) layer 34 may be formed overlying the dielectric layer, which serves as a hard mask. The dielectric layer 33 and nitride layer 34 may then be patterned to cover the areas where NFET fins 35 are to be formed, and to expose the areas where PFET fins 36 are to be formed, as seen in FIG. 3.

Figure 4:
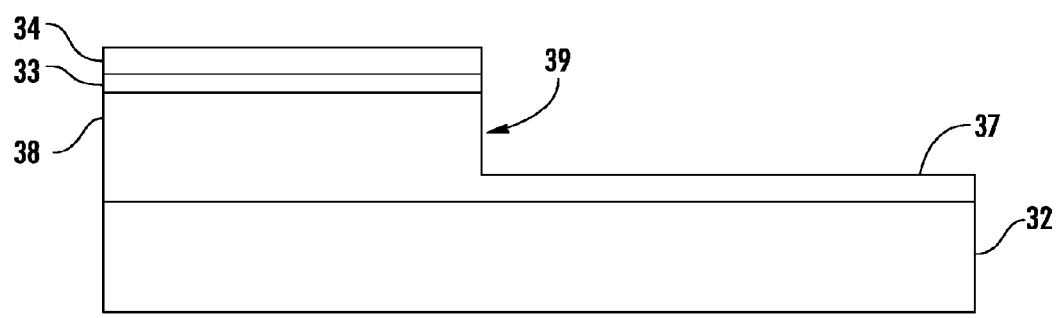

The silicon layer 31 may be etched in areas exposed by the nitride mask layer 34 to provide a thinned silicon region 37 (FIG. 4), which will provide a seed layer for deposition of a second semiconductor material, such as SiGe, as will be discussed further below. That is, the silicon region 38 that will be used to define or form the fins 35 for the NFET device will have a greater vertical thickness or height than the silicon region 37 after the etch, and the boundary between the two defines a sidewall 39 of the silicon region 38.

It should be noted that the silicon in the region 37 need not be overly etched to an undesirably small thickness (e.g., less than 10 nm), which may lead to other problems such as agglomeration, for example, as discussed above. Rather, a thickness greater than 10 nm, and more preferably from 10 nm to 20 nm, may advantageously be used, to avoid such agglomeration issues. This is because the present approach may be used with relatively high thermal budgets to provide uniform germanium diffusion, yet while avoiding undesired diffusion of germanium into the silicon region 38 that will be used to define or form the fins for the NFET device.

Figure 5:
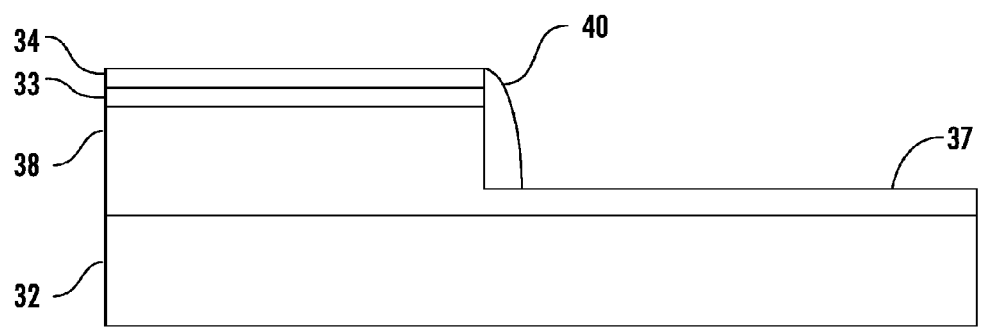
Figure 6:
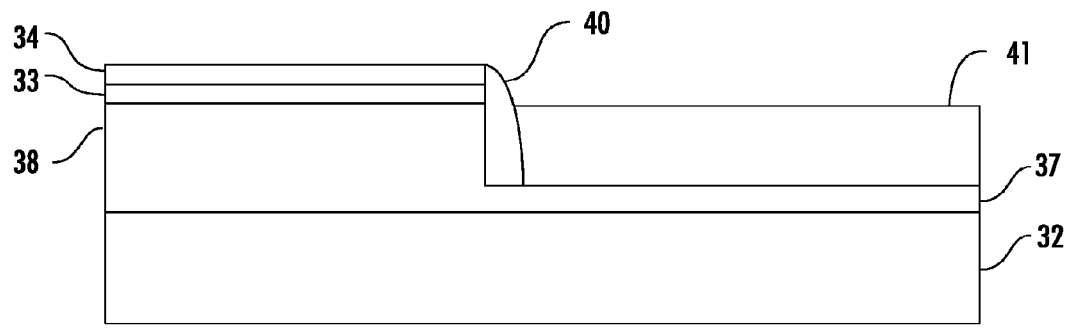

More particularly, this is achieved by first forming a spacer 40 (e.g., SiN) above the silicon region 37 and adjacent or along the sidewall 39, as seen in FIG. 5. A semiconductor region 41 of a semiconductor material different than silicon (e.g., SiGe) may be formed or deposited above the silicon region 37 and adjacent the spacer 40, as seen in FIG. 6. Thus, the spacer 40 is positioned laterally between the silicon region 38 and the SiGe region 41. Generally speaking, the amount of deposition of the SiGe may be such that the top of the SiGe region 41 is relatively close to level with the top of the silicon region 38, although different thicknesses may be used in different embodiments depending on the thickness of the underlying silicon region 37 used, as well as the desired silicon/germanium concentrations in the PFET fins 36, as will be appreciated by those skilled in the art.

Figure 7:
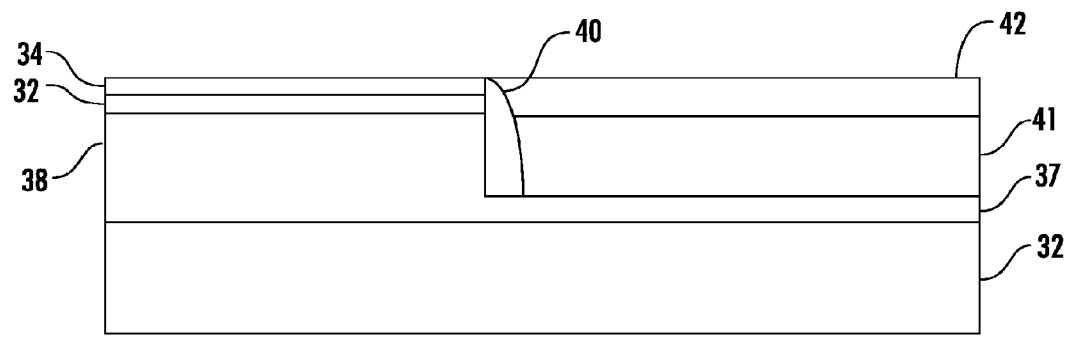
Figure 8:
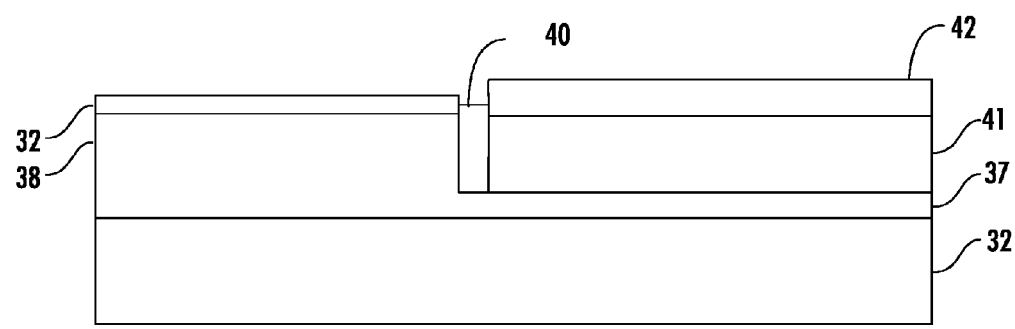
Figure 9:
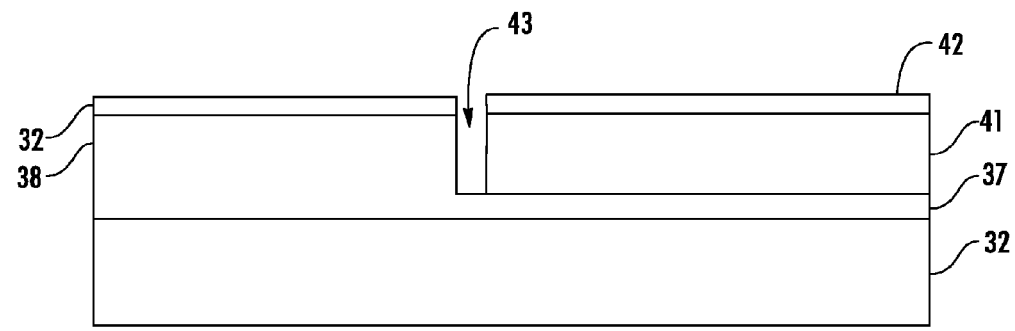
Figure 10:
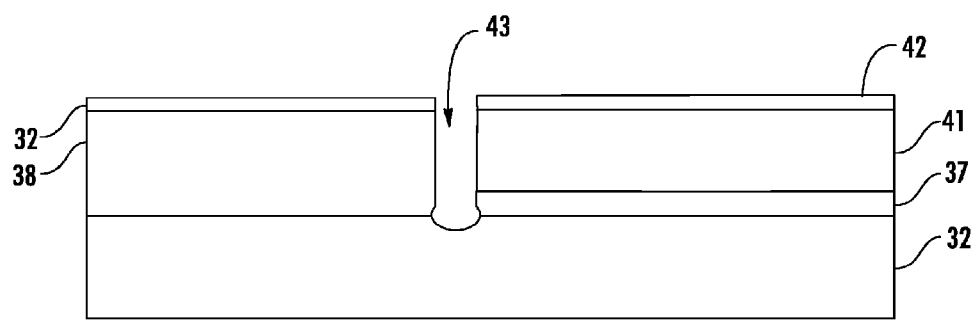
Figure 11:
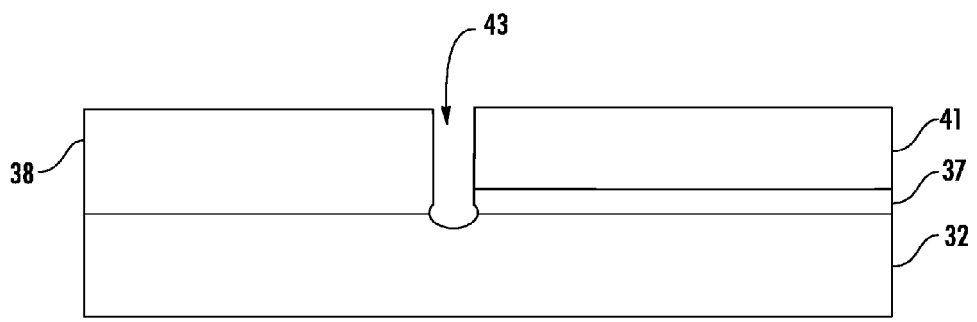

An oxide may then be formed over the structure and planarized down to the nitride layer 34 via chemical mechanical polishing (CMP), for example, which creates oxide region 42 overlying the SiGe region 41 (FIG. 7). The nitride layer 34 and spacer 40 may then be removed, as shown in FIGS. 8 and 9. By way of example, the nitride layer 34 may be removed using a dry etch, such as a reactive ion etch (RIE), for example, and the spacer 40 may be removed using a wet etch (e.g., hot phosphorus acid, etc). However, both the nitride layer 34 and the spacer 40 could be removed in a single etch step (e.g., hot phosphorus acid), if desired. Removing the spacer 40 defines a trench 43 having the silicon region 38 on one side (the left side in FIG. 9), and the SiGe region 41 on another side (the right side in FIG. 9). Since the trench 43 is defined based upon the width of the nitride spacer 40, the trench may be relatively small and accordingly not occupy an excessive amount of surface area or "real estate" that would otherwise be used for semiconductor fins.

Figure 12:
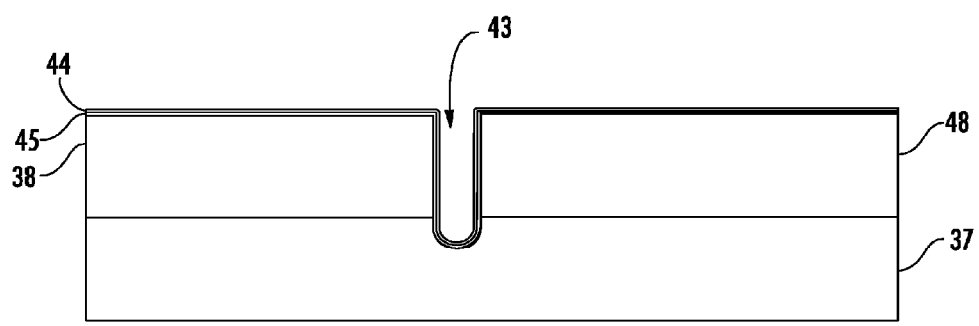

The oxide layers 32, 42 may then be used as a hard mask for etching the silicon region 37 in the bottom of the trench 43. This extends the trench to the dielectric substrate 32, which in turn separates or isolates the silicon region 38 from the silicon region 37. An oxide deglazing step may then be performed to remove the oxide hard mask regions 32, 42, followed by deposition of a liner above the silicon region 38 and SiGe region 41, and within the trench (FIG. 12). By way of example, the liner may include a relatively thin layer of SiO$_2$ 45 and an SiN layer 44 overlying the SiO$_2$ layer.

Because the silicon region 38 is physically separated from the SiGe region 41 and isolated therefrom by the trench 43, a high temperature anneal may be performed to diffuse the germanium from the SiGe region 41 into the silicon region 37 to create a uniform SiGe region 48, without germanium diffusion into the silicon region 38, as seen in FIG. 12. Since a high thermal budget may accordingly be used without germanium "bleed" into the silicon region 38, desired uniformity of the germanium diffusion may be achieved in the SiGe region 48.

Figure 14:
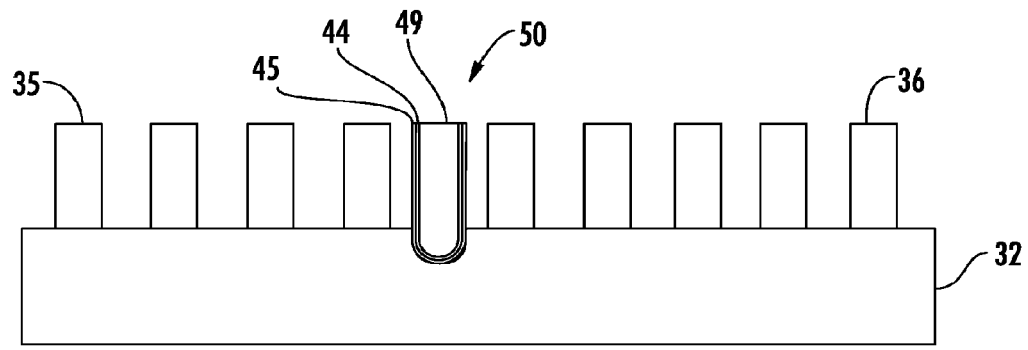
Figure 15:
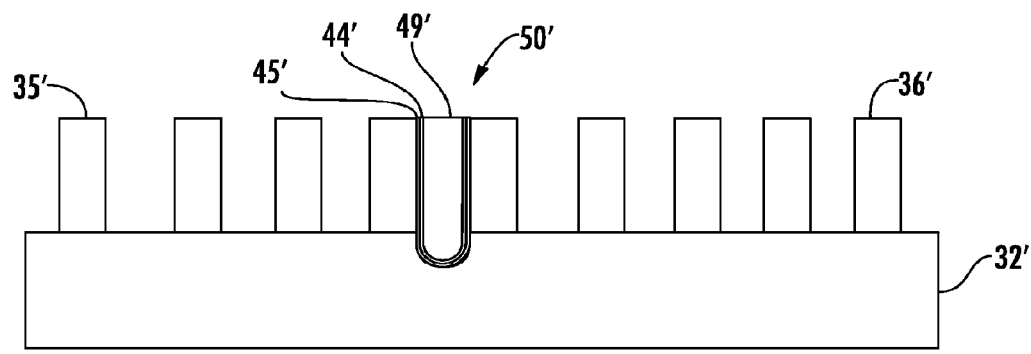
FIG. 15 is cross-sectional diagram similar to FIG. 14, and illustrating an approach for making another example embodiment of the semiconductor device of FIG. 1.

In the present example, the trench 43 is further filled with a flowable oxide (FIG. 13) to define an oxide region 49 within the trench. Upon etching or patterning of the silicon fins 35 and SiGe fins 36 from the silicon region 38 and uniform SiGe region 48, respectively, the SiO$_2$ layer 45, SiN layer 44, and oxide region 49 define an isolation pillar 50 extending above the substrate 32 and positioned laterally between the silicon and SiGe fins sets, as seen in FIG. 14. In the illustrated example, a space is etched on either side of the isolation pillar 50 so that the isolation pillar is physically separated or spaced apart from the laterally adjacent silicon fin 35 and SiGe fin 36. However, it should be noted that in other embodiments, the isolation pillar 50' may be in contact with the laterally adjacent silicon fin 35' and/or SiGe fin 36', as shown in FIG. 15.

Figure 13:
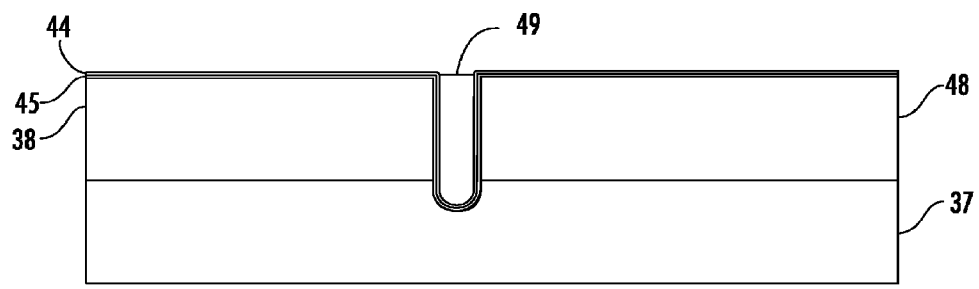
Figure 16:
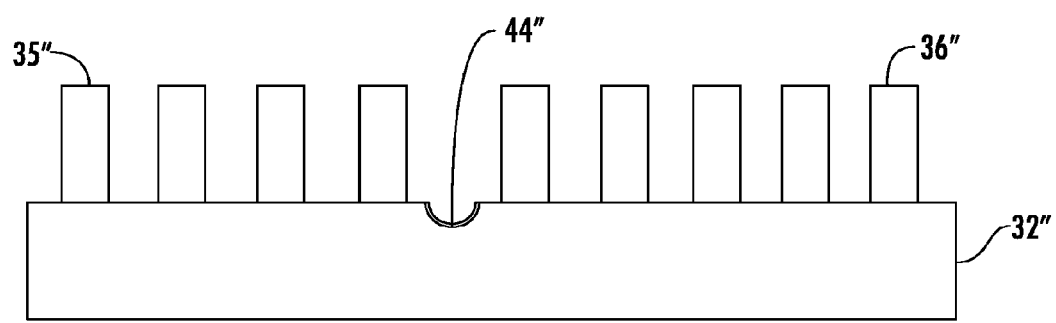
FIG. 16 is cross-sectional diagram similar to FIG. 14, and illustrating an approach for making another example embodiment of the semiconductor device of FIG. 1.

In accordance with another approach, rather than forming the oxide region 49 within the trench 43 as shown in FIG. 13 above, the trench may instead be left open, such that when the fins 35", 36" are patterned a residual portion of the nitride liner 44" remains in the isolation trench 43" in the substrate 32" and positioned between the first and second sets of fins, as shown in FIG. 16.

As seen in FIG. 1, further device processing may be performed to define a gate 55 overlying the fins 35, 36, as well as respective source and drain regions 56, 57 and 58, 59 for each of the sets of fins 35, 36. In addition to the above described advantages, the methods and devices described herein may advantageously be used for relatively small processing nodes (e.g., 7 nm, 10 nm, 14 nm, etc.). It should also be noted that in some embodiments nanowire fins may be formed. For example, the height of the silicon region 38 and SiGe region 41 may be made thinner than shown in the illustrated examples, which in turn may be patterned and formed into respective silicon and SiGe nanowire fins, such as by the approach described in U.S. application Ser. No. 14/182,601 filed Feb. 18, 2014, which is assigned to the present Applicant and is hereby incorporated herein in its entirety by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
    a substrate comprising a dielectric material;
    a first set of fins above the substrate comprising a first semiconductor material;
    a second set of fins above the substrate and comprising a second semiconductor material different than the first semiconductor material; and
    an isolation region positioned between the first and second sets of fins, the isolation region having a nitride layer, at least a portion of the isolation region being in the dielectric material that comprises the substrate.

2. The semiconductor device of claim 1 wherein the isolation region comprises an isolation pillar extending above the substrate and positioned between the first and second sets of fins.

3. The semiconductor device of claim 2 wherein at least a portion of the isolation pillar extends into the substrate.

4. The semiconductor device of claim 2 wherein the isolation pillar is spaced apart from the first and second sets of fins.

5. The semiconductor device of claim 2 wherein the isolation pillar is in contact with at least one fin from the first and second sets of fins.

6. The semiconductor device of claim 1 wherein the isolation region comprises an isolation trench positioned between the first and second sets of fins, and the nitride liner is in the isolation trench.

7. The semiconductor device of claim 6 wherein the isolation trench extends into the substrate.

8. The semiconductor device of claim 1 wherein the first semiconductor material comprises silicon, and the second semiconductor material comprises silicon germanium.

9. The semiconductor device of claim 1 further comprising:
   at least one gate overlying the first and second sets of fins; and
   respective source and drain regions electrically coupled with each of the first and second sets of fins.

10. A semiconductor device comprising:
    a substrate;
    a first set of fins have a height above the substrate and extend from a surface of the substrate comprising a first semiconductor material;
    a second set of fins have the same height above the substrate and extend from a surface of the substrate and comprising a second semiconductor material different than the first semiconductor material; and
    an isolation pillar above the substrate at a same height as the first set of fins and the second set of fins and positioned between the first and second sets of fins, at least a portion of the isolation pillar extends into the substrate below the surface of the substrate, the isolation pillar comprising an inner oxide portion, a nitride layer on the inner oxide portion, and an outer oxide layer on the nitride layer.

11. The semiconductor device of claim 10 wherein the isolation pillar is spaced apart from the first and second sets of fins.

12. The semiconductor device of claim 10 wherein the isolation pillar is in contact with at least one fin from the first and second sets of fins.

13. The semiconductor device of claim 10 wherein the first semiconductor material comprises silicon, and the second semiconductor material comprises silicon germanium.

14. The semiconductor device of claim 10 further comprising:
    at least one gate overlying the first and second sets of fins; and
    respective source and drain regions electrically coupled with each of the first and second sets of fins.

15. A semiconductor device comprising:
    a substrate comprising a dielectric material;
    a first set of fins above the substrate comprising a first semiconductor material; and
    a second set of fins above the substrate and comprising a second semiconductor material different than the first semiconductor material;
    the substrate having an isolation trench positioned between the first and second sets of fins, and a nitride liner in the isolation trench, at least a portion of the isolation trench extends into the dielectric material that comprises the substrate.

16. The semiconductor device of claim 10 wherein the substrate comprises a dielectric material.

17. The semiconductor device of claim 15 wherein the first semiconductor material comprises silicon, and the second semiconductor material comprises silicon germanium.

18. The semiconductor device of claim 15 further comprising:
    at least one gate overlying the first and second sets of fins; and
    respective source and drain regions electrically coupled with each of the first and second sets of fins.

19. The semiconductor device of claim 15 wherein the isolation trench is spaced apart from the first and second sets of fins.

* * * * *